(12) United States Patent
Lai et al.

(10) Patent No.: US 10,910,062 B2
(45) Date of Patent: Feb. 2, 2021

(54) RANDOM BIT CELL WITH NONVOLATILE MEMORY CELL

(71) Applicant: eMemory Technology Inc., Hsin-Chu (TW)

(72) Inventors: Tsung-Mu Lai, Hsinchu County (TW); Hung-Hsiang Wang, Hsinchu County (TW); Cheng-Te Yang, Hsinchu County (TW); Chih-Hsin Chen, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/698,916

(22) Filed: Nov. 27, 2019

(65) Prior Publication Data

US 2020/0258579 A1  Aug. 13, 2020

Related U.S. Application Data

(60) Provisional application No. 62/804,225, filed on Feb. 12, 2019.

(51) Int. Cl.
*G11C 16/14* (2006.01)
*G11C 16/12* (2006.01)
*G11C 16/08* (2006.01)
*G11C 7/10* (2006.01)
*G11C 16/24* (2006.01)
*G11C 16/04* (2006.01)

(52) U.S. Cl.
CPC .............. *G11C 16/14* (2013.01); *G11C 7/106* (2013.01); *G11C 7/1015* (2013.01); *G11C 7/1087* (2013.01); *G11C 16/0408* (2013.01); *G11C 16/08* (2013.01); *G11C 16/12* (2013.01); *G11C 16/24* (2013.01)

(58) Field of Classification Search
None
See application file for complete search history.

(56) References Cited

U.S. PATENT DOCUMENTS

| 7,656,698 | B1 * | 2/2010 | Poplevine | .......... G11C 16/0441 365/154 |
|---|---|---|---|---|
| 2004/0062084 | A1 | 4/2004 | Layman | |
| 2018/0039784 | A1 | 2/2018 | Hung | |

* cited by examiner

*Primary Examiner* — James G Norman
(74) *Attorney, Agent, or Firm* — Winston Hsu

(57) ABSTRACT

A random bit cell includes a latch and a nonvolatile memory cell. The nonvolatile memory cell includes a storage circuit, a control element, an erase element, and a read circuit. The storage circuit is coupled to a first terminal of the latch. The storage circuit includes a floating gate transistor having a first terminal, a second terminal, and a floating gate. The control element has a first terminal coupled to a control line, and a control terminal coupled to the floating gate of the floating gate transistor. The erase element has a first terminal coupled to an erase line, and a control terminal coupled to the floating gate of the floating gate transistor. The read circuit is coupled to a bit line, a select gate line, and the floating gate of the floating gate transistor.

21 Claims, 8 Drawing Sheets

RANDOM BIT CELL WITH NONVOLATILE MEMORY CELL

CROSS REFERENCE TO RELATED APPLICATIONS

This non-provisional application claims priority of U.S. provisional application No. 62/804,225, filed on Feb. 12, 2019, included herein by reference in its entirety.

BACKGROUND OF THE INVENTION

1. Field of the Invention

The present invention is related to a random bit cell, and more particular, to a random bit cell with nonvolatile memory cell.

2. Description of the Prior Art

To prevent electronic devices from being accessed by unauthorized personnel, manufacturers of electronic devices often need to invest a significant amount of time and money to develop countermeasures to avoid external threats. In the prior art, the physical unclonable function (PUF) circuit is often applied to protect the system from physical attacks and reverse engineering due to the intrinsic characteristics of the PUF circuit. The PUF circuit can generate random bits based on unpredictable physical characteristics.

Static random access memory (SRAM) has been used to implement the physical unclonable function circuit for generating random bits since the latch of each SRAM cell is strongly dependent on the initial charge status of the SRAM cell and the initial charge status of the SRAM cell is unpredictable and uncontrollable. However, since the random bit stored by the latch of the SRAM cell is volatile, it has to be regenerated every time when power is reset. Furthermore, the initial charge state of the SRAM cell is significantly affected by the ambient noise and surrounding environment. Therefore, as power goes on and off, the initial charge state of the SRAM cell may be changed, thereby changing the value of the random bits and causing instability of the security system employing the random bits.

SUMMARY OF THE INVENTION

One embodiment of the present invention discloses a random bit cell. The random bit cell includes a latch and a nonvolatile memory cell.

The latch has a first terminal and a second terminal. The nonvolatile memory cell includes a storage circuit, a control element, an erase element, and a read circuit. The storage circuit is coupled to the first terminal of the latch, and the storage circuit includes a floating gate transistor having a first terminal, a second terminal, and a floating gate. The control element has a first terminal coupled to a control line, and a control terminal coupled to the floating gate of the floating gate transistor. The erase element has a first terminal coupled to an erase line, and a control terminal coupled to the floating gate of the floating gate transistor. The read circuit is coupled to a bit line, a select gate line, and the floating gate of the floating gate transistor.

Another embodiment of the present invention discloses a random bit system. The random bit system includes a control line, an erase line, a select gate line, a plurality of bit lines, and a random bit page.

The random bit page includes a plurality of random bit cells, each including a latch and a nonvolatile memory cell. The latch has a first terminal and a second terminal. The nonvolatile memory cell includes a storage circuit, a control element, an erase element, and a read circuit.

The storage circuit is coupled to the first terminal of the latch, and the storage circuit includes a floating gate transistor having a first terminal, a second terminal, and a floating gate. The control element has a first terminal coupled to the control line, and a control terminal coupled to the floating gate of the floating gate transistor. The erase element has a first terminal coupled to the erase line, and a control terminal coupled to the floating gate of the floating gate transistor. The read circuit is coupled to a corresponding bit line of the plurality of bit lines, the select gate line, and the floating gate of the floating gate transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
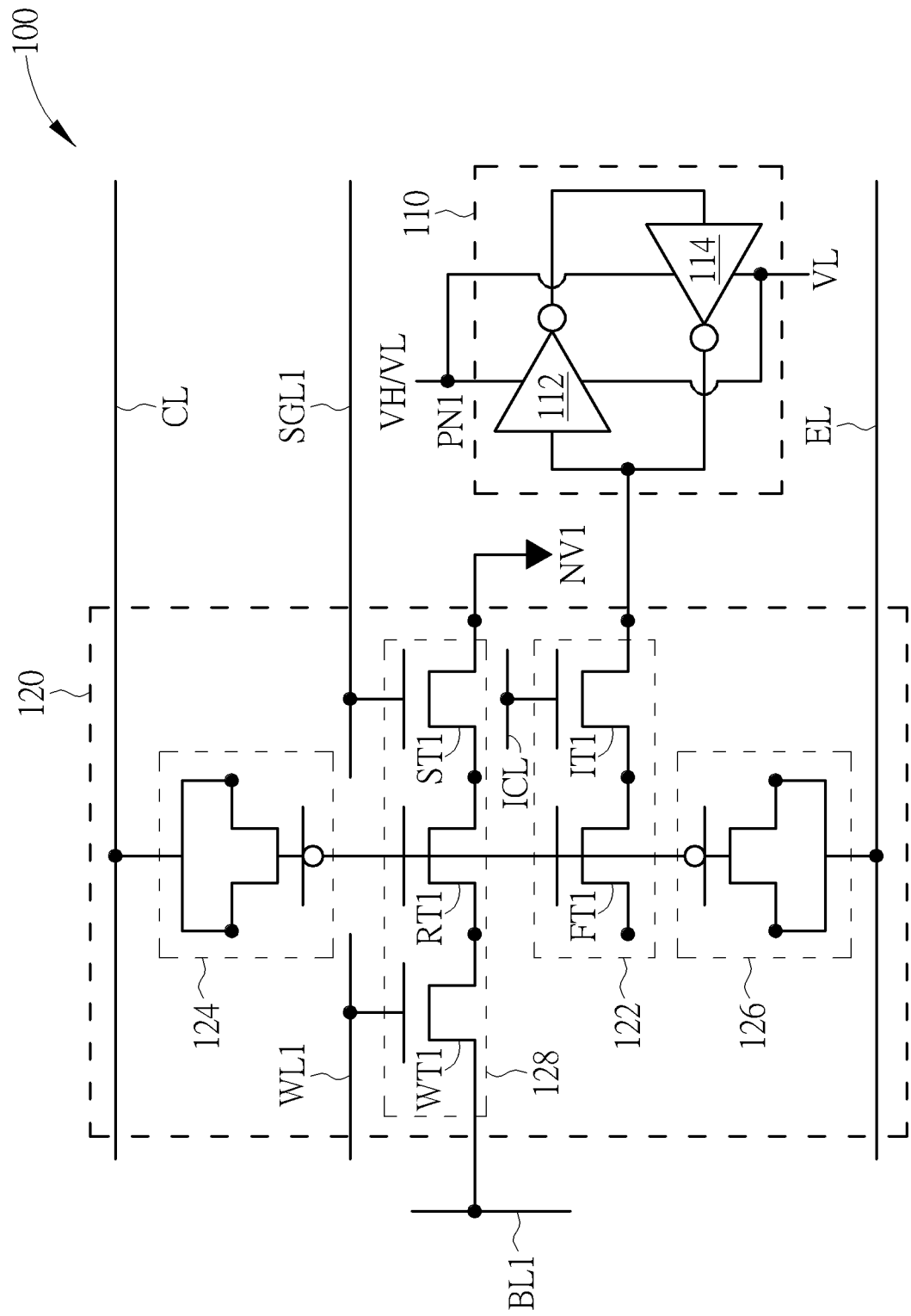
FIG. 1 shows a random bit cell according to one embodiment of the present invention.

FIG. 1 shows a random bit cell 100 according to one embodiment of the present invention. The random bit cell 100 includes a latch 110 and a nonvolatile memory cell 120.

The latch 110 has a first terminal and a second terminal. In FIG. 1, the latch 110 can be implemented by two inverters 112 and 114. The latch 110 can be disabled by inputting a low operation voltage VL to the power terminal PN1, and can be enabled by providing a high operation voltage VH to the power terminal PN1. In some embodiments, the latch 110 can be enabled without predetermined input voltages, and the latch 110 will still be settled to the high operation voltage VH and the low operation voltage VL eventually according to its initial state. Since the initial state of the latch 110 is unpredictable, the settled result is also unpredictable. Therefore, the settled result generated by the latch 110 is suitable to be used as a random bit, and the state of the latch 110 can be used to program the non-volatile memory cell 120 so as to store the settled result for future usage.

In FIG. 1 the nonvolatile memory cell 120 includes a storage circuit 122, a control element 124, an erase element 126, and a read circuit 128.

The storage circuit 122 is coupled to the first terminal of the latch 110. The storage circuit 122 includes a floating gate transistor FT1, and an isolation transistor IT1. The floating gate transistor FT1 has a first terminal, a second terminal being floating, and a floating gate. The isolation transistor IT1 has a first terminal coupled to the first terminal of the latch 110, a second terminal coupled to the first terminal of the floating gate transistor FT1, and a control terminal coupled to an isolation control line ICL.

The control element 124 has a first terminal coupled to a control line CL, and a control terminal coupled to the floating gate of the floating gate transistor FT1. The erase element 126 has a first terminal coupled to an erase line EL, and a control terminal coupled to the floating gate of the floating gate transistor FT1. The read circuit 128 is coupled to a first bit line BL1, a select gate line SGL1, and the floating gate of the floating gate transistor FT1.

In some embodiments, the control element 124 and the erase element 126 can be capacitive coupling elements. For example, the control element 124 can be implemented by a transistor. In this case, the first terminal of the control element 124 can be the source and/or the drain of the transistor, and the control terminal can be the gate of the transistor. Similarly, the erase element 126 can be implemented by a transistor. The first terminal of the erase element 126 can be the source and/or the drain of the transistor, and the control terminal can be the gate of the transistor. Furthermore, the control terminal of the control element 124, the control terminal of the erase element 126 and the floating gate of the floating gate transistor FT1 can be coupled together through the same polysilicon layer. In some embodiments, the coupling area of the control element 124 can be greater than the coupling area of the erase element 126, and the coupling area of the erase element 126 can be smaller than the floating gate of the floating gate transistor FT1. Therefore, the floating gate of the floating gate transistor FT1 will be always coupled to a voltage close to the voltage of the first terminal of the control element. Consequently, different operations can be performed by the random bit cell 100 with the control line CL and the erase line EL.

The read circuit 128 includes a word select transistor WT1, a read transistor RT1, and a select gate transistor ST1. The word select transistor WT1 has a first terminal coupled to the first bit line BL1, a second terminal, and a control terminal coupled to a word line WL1. The read transistor RT1 has a first terminal coupled to the second terminal of the word select transistor WT1, a second terminal, and a floating gate coupled to the floating gate of the first floating gate transistor FT1. The select gate transistor ST1 has a first terminal coupled to the second terminal of the read transistor RT1, a second terminal coupled to a first voltage terminal NV1, and a control terminal coupled to the select gate line SGL1.

Figure 2:
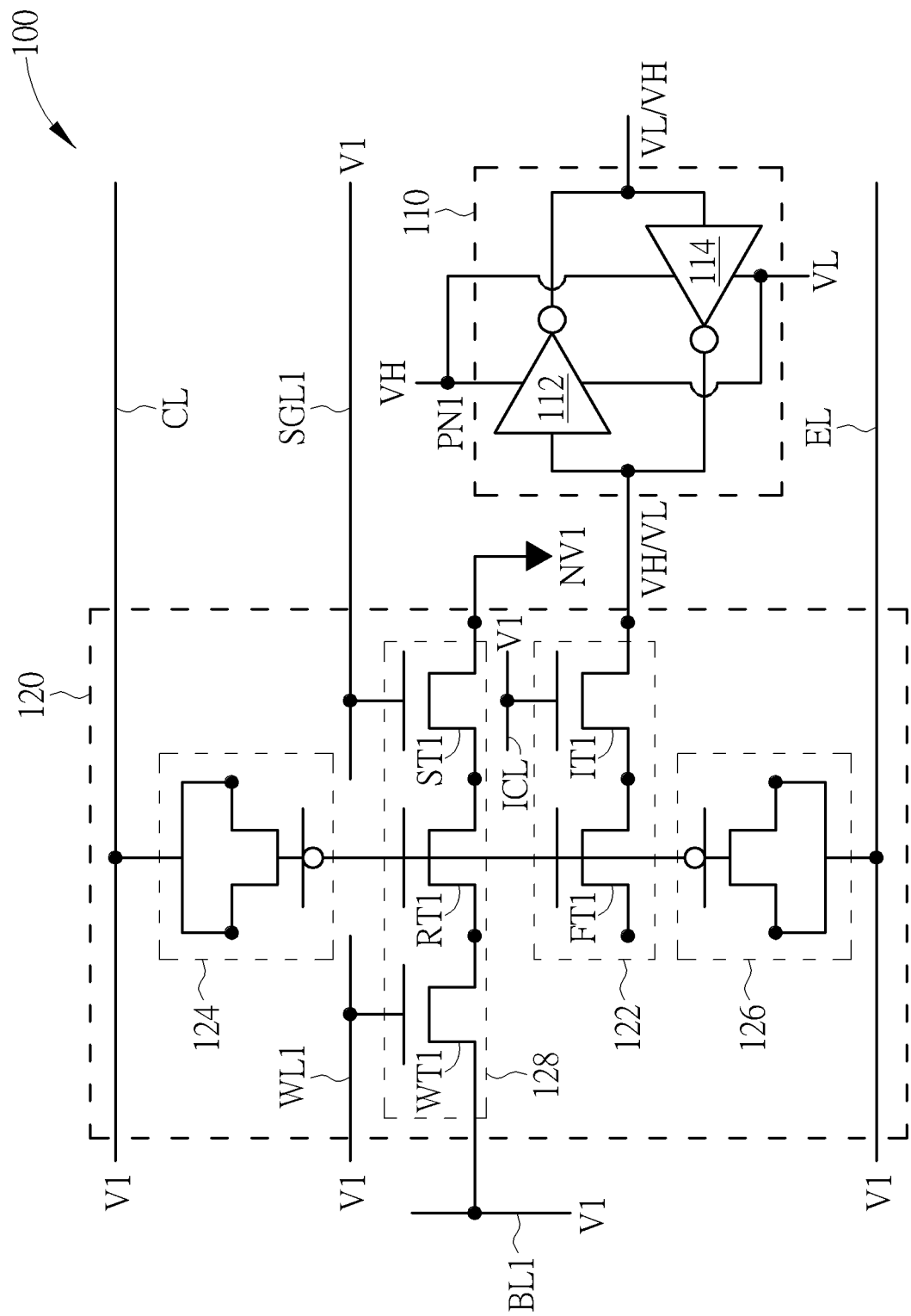
FIG. 2 shows the voltages received by the random bit cell in FIG. 1 during a first stage of an enroll operation.

FIG. 2 shows the voltages received by the random bit cell 100 during a first stage of an enroll operation. In FIG. 2, the first bit line BL1, the control line CL, and the erase line EL can be at a first voltage V1. The first voltage V1 can be a reference voltage or a ground voltage, for example but not limited to, 0V. Also, the word line WL1 and the select gate line SGL1 are both at the first voltage V1 so the read circuit 128 is inactivated.

Furthermore, in the first stage of the enroll operation, the latch 110 can be enabled by providing the high operation VH to the power terminal PN1 of the latch 110, and the latch 110 can settle one of the first terminal and the second terminal of the latch 110 to be at a high operation voltage VH and the other to be at a low operation voltage VL due to ambient noise and process variation. That is, during the first stage of the enroll operation, the latch 110 will enter a stable status according to the initial state of the latch 110. As a result, the first terminal and the second terminal of the latch 110 will be settled to two different voltages, the high operation voltage VH and the low operation voltage VL.

Figure 3:
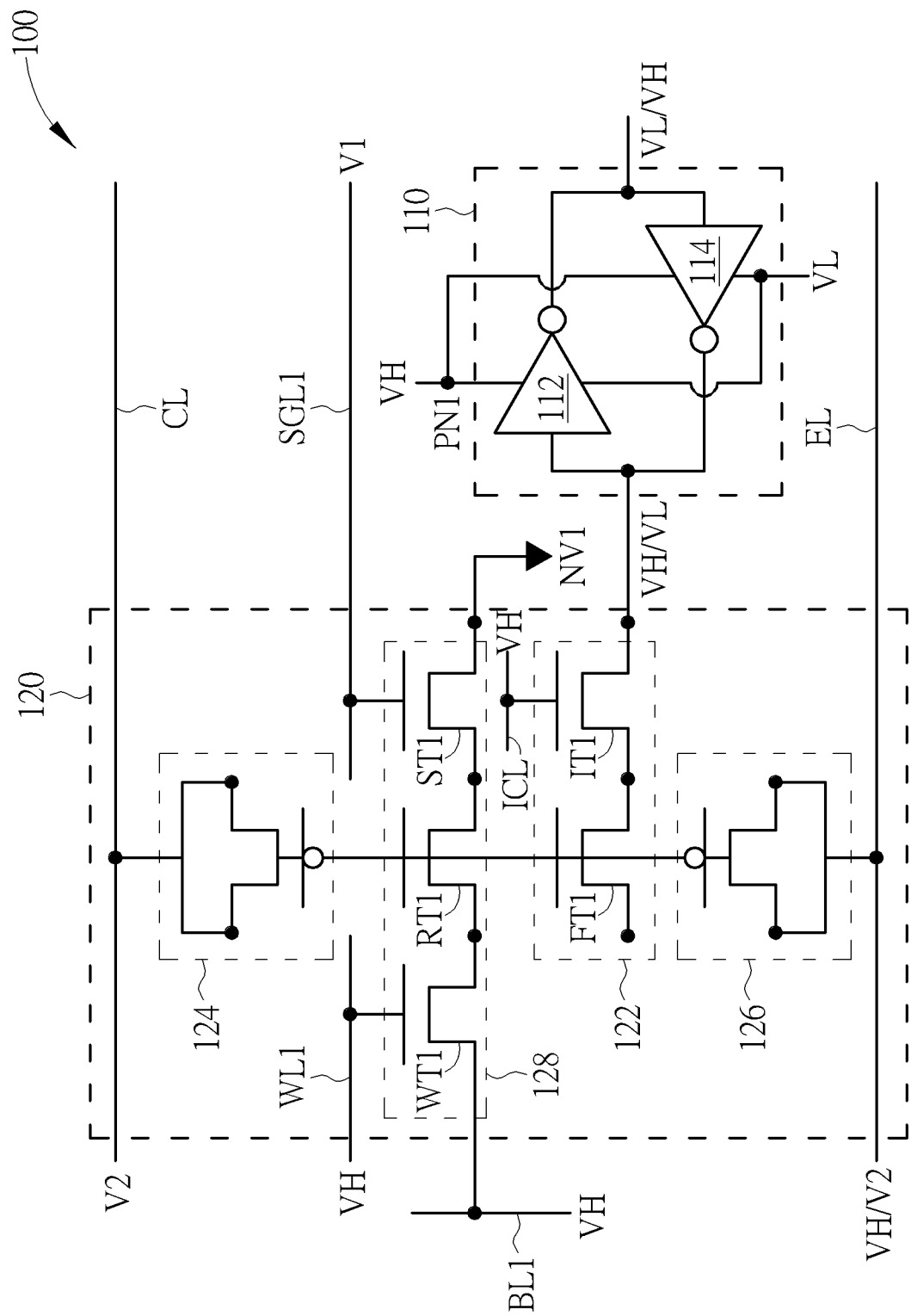
FIG. 3 shows the voltages received by the random bit cell in FIG. 1 during the second stage of the enroll operation.

After the latch 110 enters to the stable status, the second stage of the enroll operation can be performed to record the status with the nonvolatile memory cell 120. FIG. 3 shows the voltages received by the random bit cell 100 during the second stage of the enroll operation. In FIG. 3, the control line CL is at a second voltage V2, and the erase line EL is at the second voltage V2 or the high operation voltage VH.

Also, the select gate line SGL1 can be at the low operation voltage VL for turning off the select gate transistor ST1. Therefore, the read circuit 128 remains inactivated. In FIG. 3, the word line WL1 and the first bit line BL1 can both be at the high operation voltage VH for turning off the word select transistor WT1 and preventing the FN tunneling from occurring on the floating gate of the read transistor RT1. Furthermore, the isolation control line ICL can be at the high operation voltage VH to turn on the isolation transistor IT1 for transmitting the voltage of the first terminal of the latch 110 to the first terminal of the floating gate transistor FT1.

In some embodiments, the second voltage V2 is greater than the high operation voltage VH, the high operation voltage VH is greater than the low operation voltage VL, and the low operation voltage VL can be substantially equal to the first voltage V1. In some embodiments, the second voltage V2 can be 10V, the high operation voltage VH can be 5V, the low operation voltage VL and the first voltage V1 can be 0V.

During the second stage of the enroll operation, if the first terminal of the latch 110 is settled to the low operation voltage VL after the first stage of the enroll operation, the voltage applied on the floating gate of the floating gate transistor FT1, that is, the voltage between the second voltage V2 and the low operation voltage VL, will be great enough to cause Fowler-Nordheim (FN) tunneling at the floating gate of the floating gate transistor FT1. That is, the nonvolatile memory cell 120 will be programmed.

However, if the first terminal of the latch 110 is settled to the high operation voltage VH after the first stage of the enroll operation, the voltage applied on the floating gate of the floating gate transistor FT1 will not be great enough to cause Fowler-Nordheim (FN) tunneling. In this case, the nonvolatile memory cell 120 will not be programmed.

That is, according to the result of the settlement of the latch 110, the nonvolatile memory cell 120 will be programmed or not be programmed accordingly. Therefore, the result of the settlement of the latch 110 can be stored by the nonvolatile memory cell 120. Furthermore, since the nonvolatile memory cell 120 can be programmed with FN tunneling, the enroll operation can be performed with small current loading and the power consumption can be saved.

Figure 4:
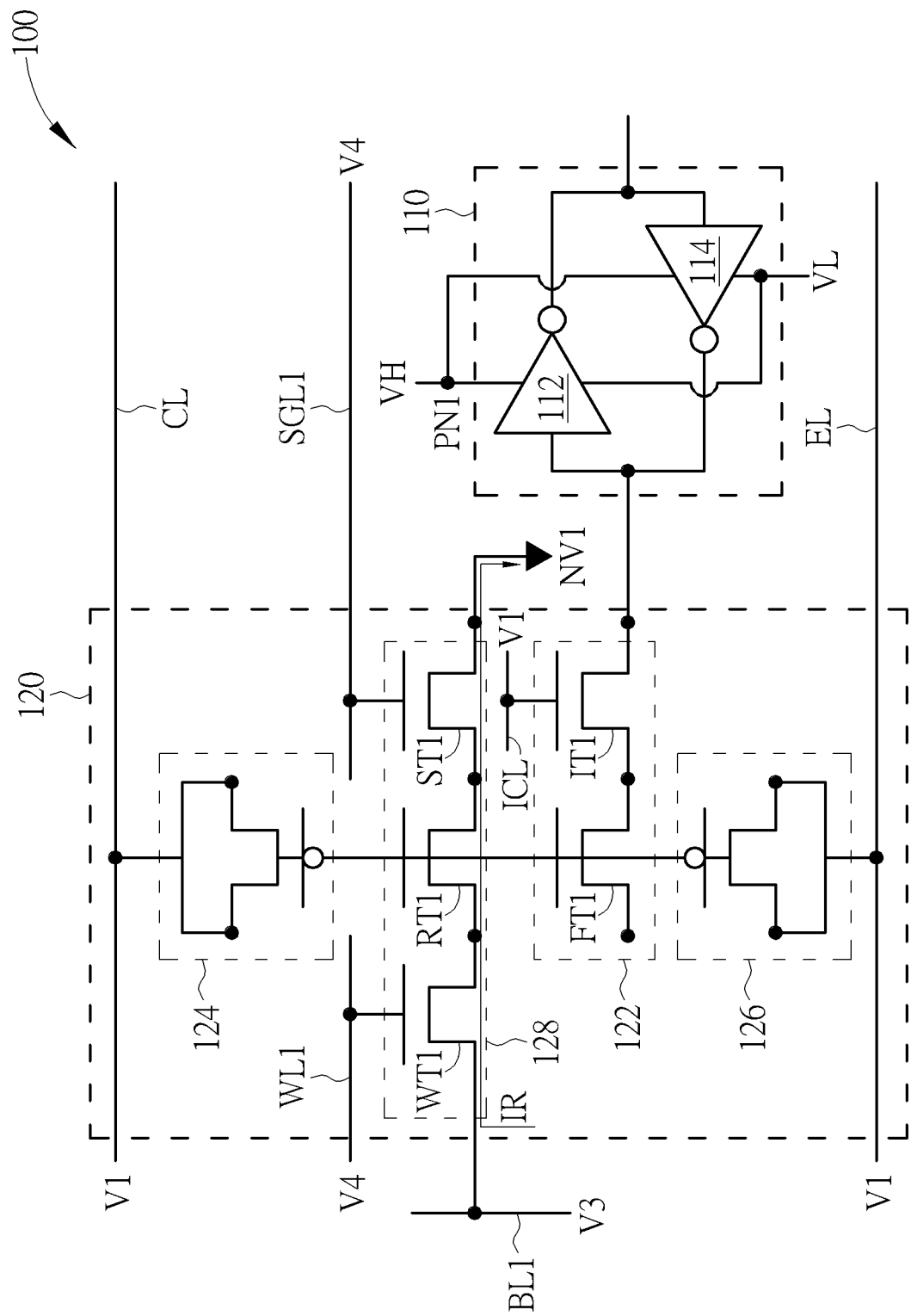
FIG. 4 shows the voltages received by the random bit cell in FIG. 1 during a read operation.

FIG. 4 shows the voltages received by the random bit cell 100 during a read operation. In FIG. 4, the control line CL, the isolation control line ICL, and the erase line EL are at the first voltage V1. The first bit line BL1 can be pre-charged to a third voltage V3. Also, the word line WL1 and the select control line SGL1 are at a fourth voltage V4 so the word select transistor WT1 and the select gate transistor ST1 can be turned on to activate the read circuit 128. The isolation transistor IT1 can be turned off to isolate the latch 110 and the floating gate transistor FT1. In some embodiments, the fourth voltage V4 can be greater than the third voltage V3. For example, the fourth voltage V4 can be 2.5V, and the third voltage can be 1.2V.

In this case, a read current $I_R$ flowing from the first bit line BL1 to the first voltage terminal NV1 may be generated by the read current 128 according to the state of the floating gate of the floating gate transistor FT1. For example, if the nonvolatile memory cell 120 has been programmed during the enroll operation, then the threshold voltage of the read transistor RT1 will be raised as the FN tunneling at the floating gate of the floating gate transistor FT1. In this case, the read transistor RT1 should be turned off, and the read current $I_R$ generated by the read circuit 128 would be insignificant or close to zero. However, if the nonvolatile memory cell 120 has not been programmed during the enroll operation, then the read transistor RT1, the word select transistor WT1, and the select gate transistor ST1 would all be turned on, and the read current $I_R$ generated by the read circuit 128 would be significant enough to be identified.

Therefore, by sensing the read current $I_R$, the random bit stored in the nonvolatile memory cell 120 can be identified. Also, in some embodiments, an erase operation can be performed before the enroll operation to ensure the random bit cell 100 to be unbiased before the enrollment. Also, in some embodiments, the erase operation may also be performed when the system is required to remove the track of the random bit for the purpose of information safety. In this case, the enroll operation can be performed again later when the random bit is required.

Figure 5:
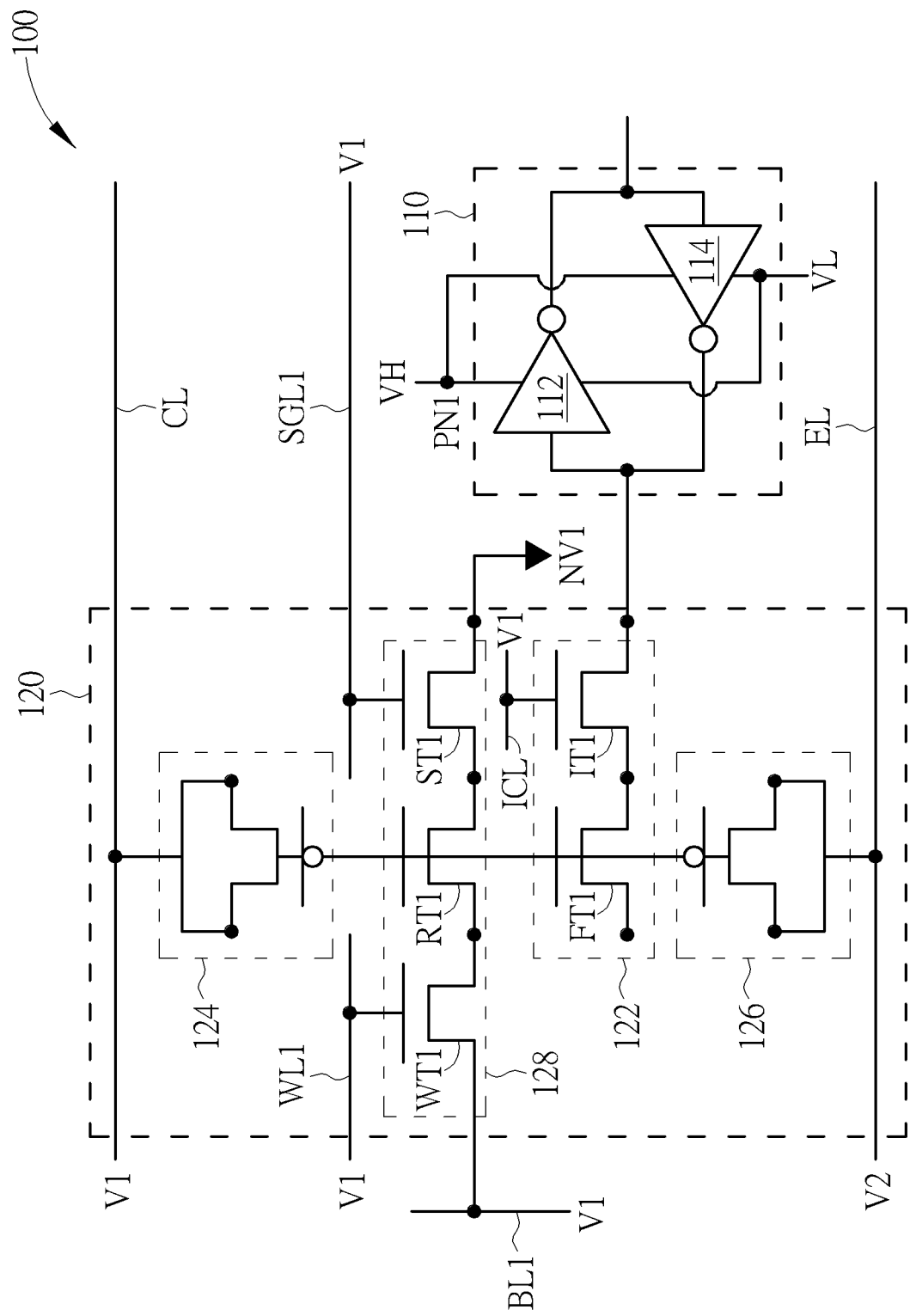
FIG. 5 shows the voltages received by the random bit cell in FIG. 1 during the erase operation.

FIG. 5 shows the voltages received by the random bit cell 100 during the erase operation. In FIG. 5, the first bit line BL1, the isolation control line ICL, and the control line CL are at the first voltage V1, the erase line EL is at the second voltage V2. Also, the isolation transistor IT1 is turned off, and the read circuit 128 and the latch 110 are inactivated.

In this case, if the nonvolatile memory cell 120 has been programmed previously, then the electrons trapped in the floating gate of the floating gate transistor FT1 can be released through the erase element 126 during the erase operation due to Fowler-Nordheim (FN) tunneling.

Consequently, the random bit cell 100 can re-generate the random bit according to the unpredictable initial state of the latch 110, and store the random bit with the nonvolatile memory cell 120. Furthermore, since the nonvolatile memory cell 120 can be programmed with FN tunneling, the enroll operation can be performed and be erased with small current loading and the power consumption can be saved.

Although the random bit cell 100 includes one nonvolatile memory cell 120 as shown in FIG. 1, the random bit cell 100 may further include another nonvolatile memory cell coupled to the second terminal of the latch 110 for differential reading in some embodiments.

Figure 6:
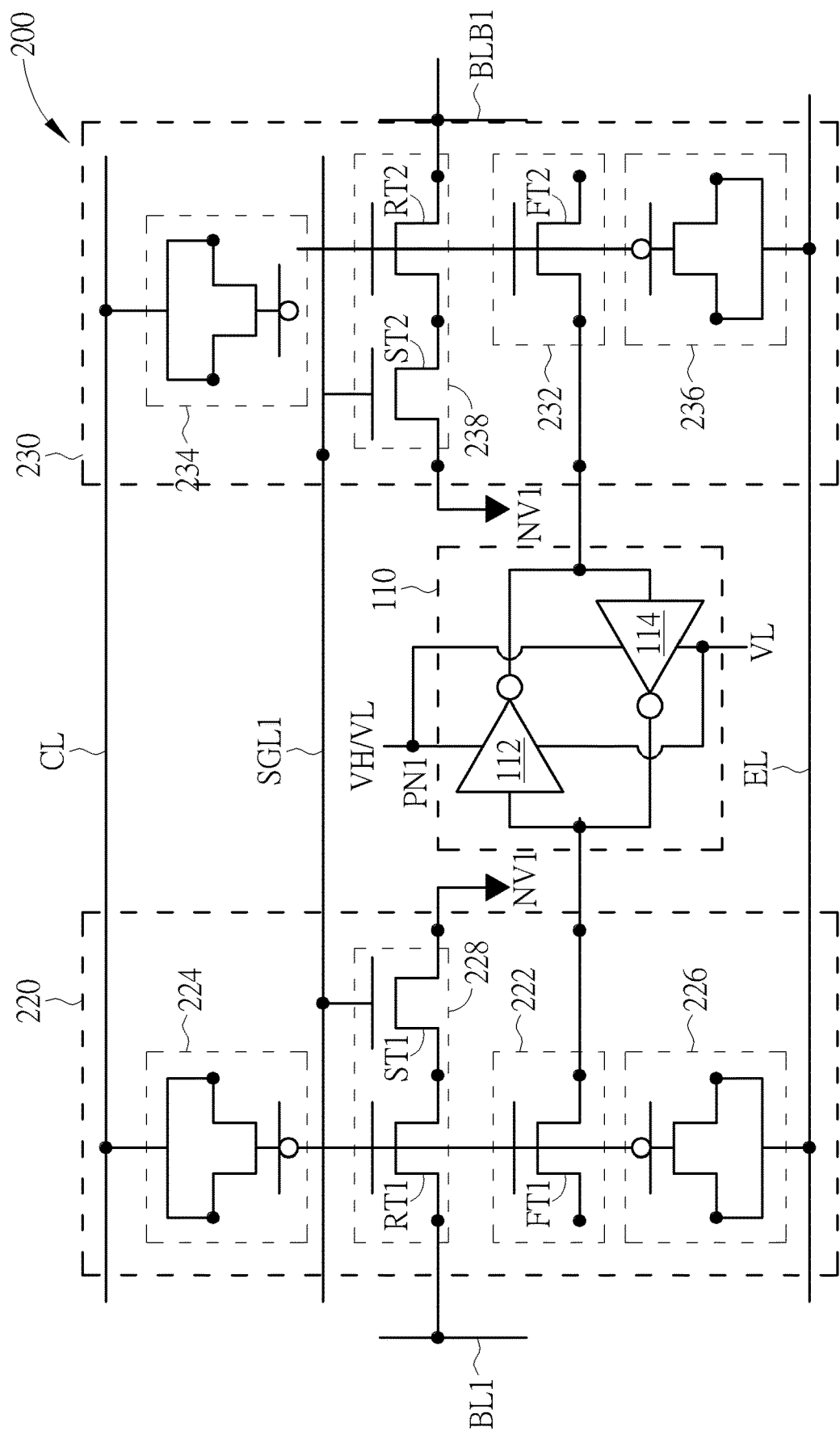
FIG. 6 shows a random bit cell according to another embodiment of the present invention.

FIG. 6 shows a random bit cell 200 according to another embodiment of the present invention. The random bit cell 200 and the random bit cell 100 have similar structures and can be operated with similar principles. However, the random bit cell 200 can include two nonvolatile memory cells 220 and 230 coupled to the first terminal and the second terminal of the latch 110 respectively.

The nonvolatile memory cell 220 and the nonvolatile memory cell 120 have similar structures. However, the storage circuit 222 includes the floating gate transistor FT1 but does not include the isolation transistor IT1. In this case, the first terminal of the floating gate transistor FT1 can be coupled to the first terminal of the latch 110 directly, and the second terminal of the floating gate transistor FT1 can be floating.

Also, the read circuit 228 can include a read transistor RT1 and a select gate transistor ST1. However, the word select transistor WT1 used in the read circuit 128 can be omitted in the read circuit 228. In this case, the first terminal of the read transistor RT1 can be coupled to the first bit line BL1 directly, and the address decoding required in the read operation can be performed by the select gate line SGL1.

Furthermore, the two nonvolatile memory cells 220 and 230 can have the same structures. For example, the nonvolatile memory cell 230 can include a storage circuit 232, a control element 234, an erase element 236, and a read circuit 238.

The storage circuit 232 is coupled to the second terminal of the latch 110, the storage circuit 232 includes a floating gate transistor FT2. The control element 234 has a first terminal coupled to the control line CL, and a control terminal coupled to the floating gate of the floating gate transistor FT2. The erase element 236 has a first terminal coupled to the erase line EL, and a control terminal coupled to the floating gate of the floating gate transistor FT2. The read circuit 238 can be coupled to a second bit line BLB1, the select gate line SGL1, and the floating gate of the floating gate transistor FT2. In FIG. 6, the read circuit 238 can include a read transistor RT2 and a select gate transistor ST2. The read transistor RT2 can be coupled to the second bit line BLB1 and the floating gate transistor FT2, and the select gate transistor ST2 can be coupled to the read transistor RT2 and the select gate line SGL1.

In addition, the two nonvolatile memory cells 220 and 230 can be coupled to different terminals of the latch 110. Since the latch 110 will settle the first terminal and the second terminal to different voltages during the enroll operation, the nonvolatile memory cells 220 and 230 will record different states. That is, after the enroll operation one of the nonvolatile memory cells 220 and 230 will be programmed while the other will not. In this case, during the read operation, the currents generated by the nonvolatile memory cells 220 and 230 can be read differentially so the reading result can be determined faster.

Consequently, the random bit cell 200 can generate the random bit according to the unpredictable initial charge state of the latch 110, and store the random bit with the nonvolatile memory cells 220 and 230. Furthermore, since the nonvolatile memory cells 220 and 230 can be programmed and be erased with FN tunneling, the enroll operation can be performed with small current loading and the power consumption can be saved.

Figure 7:
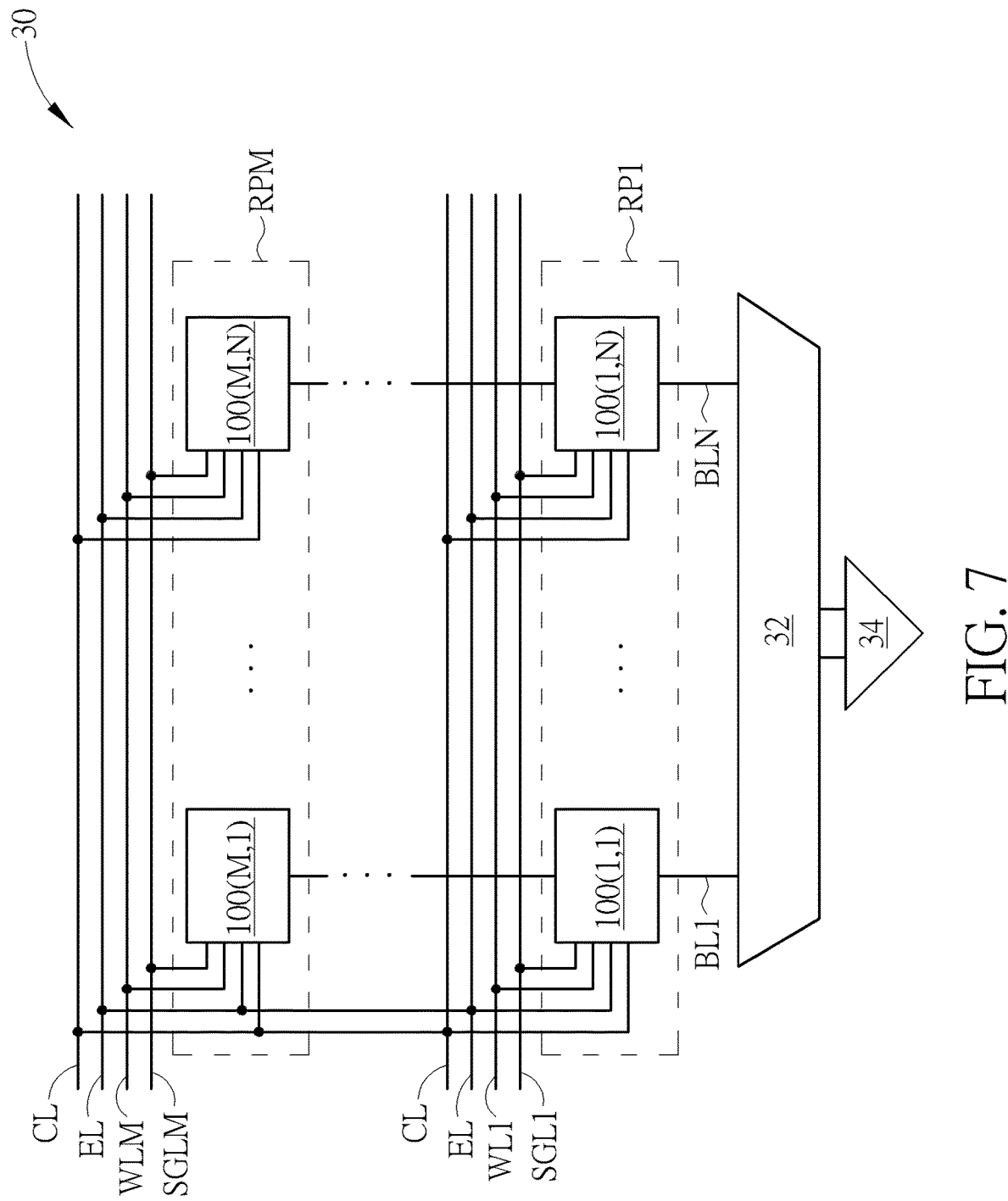
FIG. 7 shows a random bit system according to one embodiment of the present invention.

FIG. 7 shows a random bit system 30 according to one embodiment of the present invention. The random bit system 30 includes a control line CL, an erase line EL, a plurality of select gate lines SGL1 to SGLM, a plurality of word lines WL1 to WLM, a plurality of first bit lines BL1 to BLN, and a plurality of random bit pages RP1 to RPM, where M and N are positive integers.

Each random bit page RP1 to RPM includes N random bit cells. For example, the random bit page RP1 can include random bit cells 100(1,1) to 100(1,N), and the random bit page RPM can include random bit cells 100(M,1) to 100(M,N).

In some embodiments, the random bit cells 100(1,1) to 100(M,N) can be implemented with the random bit cell 100 shown in FIG. 1. Furthermore, since the enroll operations and the erase operations are performed with FN tunneling, the required currents are rather small, thereby allowing the random bit cells 100(1,1) to 100(M,N) to be enrolled simultaneously and to be erased simultaneously. For example, in FIG. 7, the random bit cells 100(1,1) to 100(M,N) can be coupled to the same control line CL and the same erase line so the random bit cells 100(1,1) to 100(M,N) can be erased during the same erase operation and can be enrolled during the same enroll operation. Consequently, the random bit system 30 is able to generate a plurality of random bits in a short time, thereby improving the flexibility of the information safety mechanism.

Although the random bit cells 100(1,1) to 100(M,N) can be erased simultaneously and enrolled simultaneously, the random bit cells 100(1,1) to 100(M,N) can be read individually. In FIG. 7, the random bit system 30 can further include a multiplexer 32 and a sensing amplifier 34.

The multiplexer 32 can be coupled to the first bit lines BL1 to BLN, and the sensing amplifier 34 can be coupled to the multiplexer 32. In some embodiments, the word lines WL1 to WLM and the select gate lines SGL1 to SGLM can be used to select the random bit page to be read, and the random bits stored in the selected random bit cells can be read sequentially with the multiplexer 32 and the sensing amplifier 34. For example, the random bit page RP1 can be selected by raising the voltages on the word line WL1 and the select gate line SGL1 during the read operation, and the multiplexer 32 will transmit the read currents generated by the random bit cells 100(1,1) to 100(1,N) to the sensing amplifier 34 sequentially.

Figure 8:
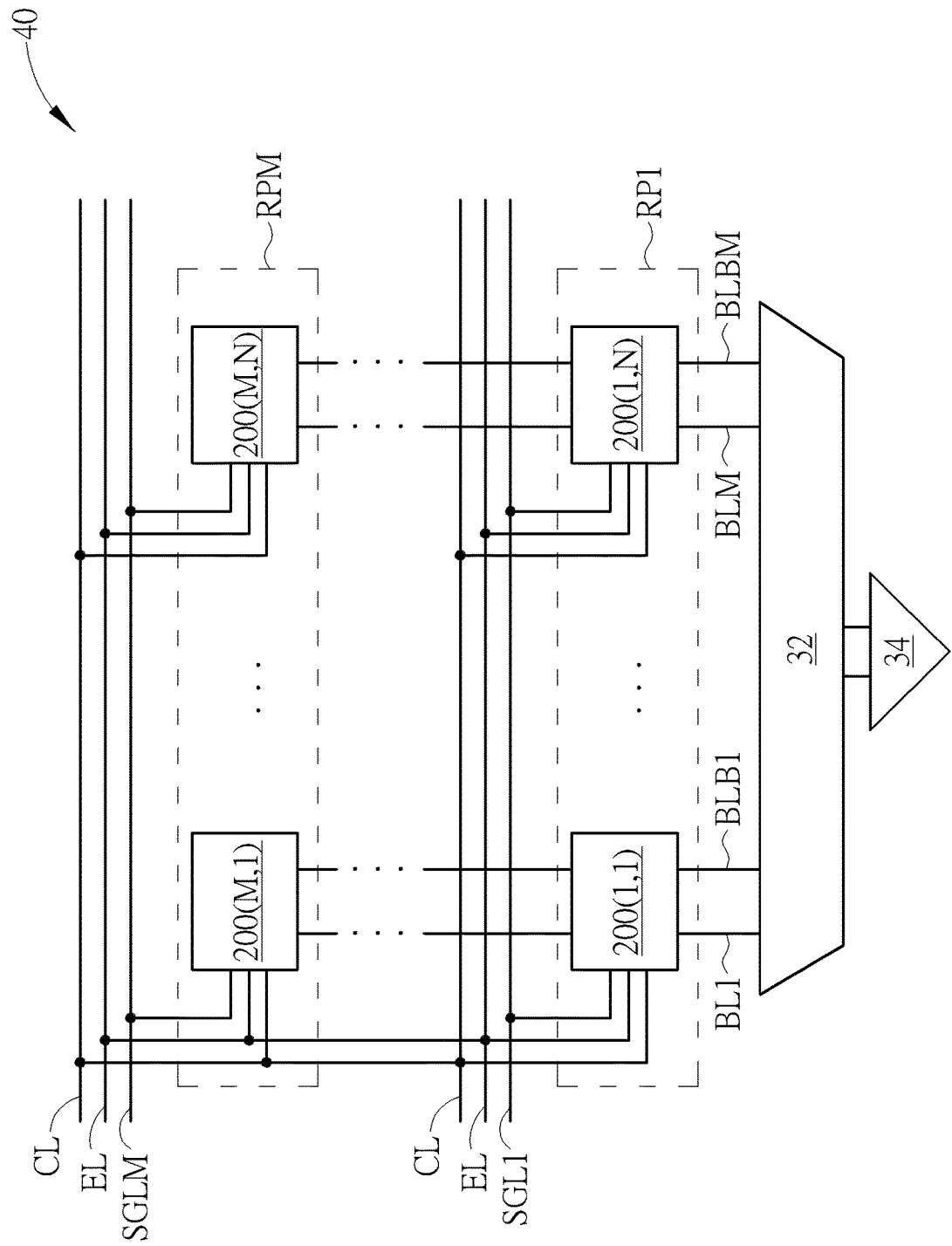
FIG. 8 shows a random bit system according to another embodiment of the present invention.

FIG. 8 shows a random bit system 40 according to another embodiment of the present invention. The random bit system 40 includes a control line CL, an erase line EL, a plurality of select gate lines SGL1 to SGLM, a plurality of first bit lines BL1 to BLN, a plurality of second bit lines BLB1 to BLBN, and a plurality of random bit pages RP1 to RPM. Each of the random bit pages RP1 to RPM includes N random bit cells. In FIG. 8, the random bit page RP1 can include the random bit cells 200(1,1) to 200(1,N), and the random bit page RPM can include the random bit cells 200(M,1) to 200 (M,N). The random bit cells 200 (1, 1) to 200(M,N) can be implemented with the random bit cell 200 shown in FIG. 6.

In this case, the random bit cells 200(1,1) to 200(M,N) can still be enrolled during the same enroll operation, and can be erased during the same erase operation. Also, during the read operation, the random bit pages RP1 to RPM can be selected with the select gate lines SGL1 to SGLM, and the multiplexer 42 can transmit the currents on the first bit lines BL1 to BLN and the second bit lines BLB1 to BLBN to the sensing amplifier 44 sequentially. Since each of the random bit cells 200(1,1) to 200(M,N) can include two nonvolatile memory cells recording complementary bits, the sensing amplifier 44 can read the random bit with a differential manner by comparing the currents flowing on the two corresponding bit lines.

Furthermore, in some embodiments, the floating gate transistor FT1 can be implemented by a stacked-gate element or a charge-trapping element that can be programmed by either F-N tunneling or band-to-band tunneling. For example, the NOR-type stacked-gate electrically-erasable programmable read-only memory (EEPROM) cell and the NOR-type silicon-oxide-nitride-oxide-silicon (SONOS) can be adopted according to the system requirement.

In summary, the random bit cell and the random bit system provided by the embodiments of the present invention can generate the random bits with the latches and store the random bits with the nonvolatile memory cells. Also, since the nonvolatile memory cells can be programmed with FN tunneling, the currents required for enrollment is rather small, thereby allowing the simultaneous enroll operation for multiple random bit cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A random bit cell comprising:
a latch having a first terminal and a second terminal; and
a first nonvolatile memory cell comprising:
    a first storage circuit coupled to the first terminal of the latch, the first storage circuit comprising a first floating gate transistor having a first terminal, a second terminal, and a floating gate;
    a first control element having a first terminal coupled to a control line, and a control terminal coupled to the floating gate of the first floating gate transistor;
    a first erase element having a first terminal coupled to an erase line, and a control terminal coupled to the floating gate of the first floating gate transistor; and
    a first read circuit coupled to a first bit line, a select gate line, and the floating gate of the first floating gate transistor, wherein the first terminal of the first floating gate transistor is coupled to the first terminal of the latch, and the second terminal of the first floating gate transistor is floating.

2. The random bit cell of claim 1,
wherein during a first stage of an enroll operation:
the first bit line, the control line, and the erase line are at a first voltage;
the first read circuit is inactivated; and
the latch is configured to be enabled and settle one of the first terminal and the second terminal of the latch to be at a high operation voltage and another to be at a low operation voltage.

3. The random bit cell of claim 2, wherein
during a second stage of the enroll operation:
the control line is at a second voltage;
the erase line is at the second voltage or the high operation voltage;
the first bit line is at the high operation voltage;
the first read circuit is inactivated; and
if the first terminal of the latch is settled to the low operation voltage after the first stage of the enroll operation, a voltage applied on the floating gate of the first floating gate transistor causes FowlerNordheim (FN) tunneling at the floating gate of the first floating gate transistor.

4. The random bit cell of claim 1, wherein:
the first storage circuit further comprises an isolation transistor having a first terminal coupled to the first terminal of the latch, a second terminal coupled to the first terminal of the first floating gate transistor, and a control terminal;
the isolation transistor is configured to be turned on during an enroll operation; and
the second terminal of the first floating gate transistor is floating.

5. The random bit cell of claim 1, wherein the first read circuit comprises:
a word select transistor having a first terminal coupled to the first bit line, a second terminal, and a control terminal coupled to a word line;
a read transistor having a first terminal coupled to the second terminal of the word select transistor, a second terminal, and a floating gate coupled to the floating gate of the first floating gate transistor; and
a select gate transistor having a first terminal coupled to the second terminal of the read transistor, a second terminal coupled to a first voltage terminal, and a control terminal coupled to the select gate line.

6. The random bit cell of claim 5, wherein during a read operation:
the control line and the erase line are at a first voltage;
the first bit line is at a third voltage;
the word line and the select control line are at a fourth voltage; and
the first read circuit is configured to generate a read current through the first bit line according to a state of the floating gate of the first floating gate transistor.

7. The random bit cell of claim 1, wherein the first read circuit comprises:
a read transistor having a first terminal coupled to the first bit line, a second terminal, and a floating gate coupled to the floating gate of the first floating gate transistor; and
a select gate transistor having a first terminal coupled to the second terminal of the read transistor, a second terminal coupled to a first voltage terminal, and a control terminal coupled to the select gate line.

8. The random bit cell of claim 1, wherein during an erase operation before an enroll operation:
the first bit line and the control line are at a first voltage;
the erase line is at a second voltage; and
the first read circuit and the latch are inactivated.

9. The random bit cell of claim 1, further comprising a second nonvolatile memory cell comprising:
a second storage circuit coupled to the second terminal of the latch, the second storage circuit comprising a second floating gate transistor having a first terminal, a second terminal, and a floating gate;
a second control element having a first terminal coupled to the control line, and a control terminal coupled to the floating gate of the second floating gate transistor;
a second erase element having a first terminal coupled to the erase line, and a control terminal coupled to the floating gate of the second floating gate transistor; and
a second read circuit coupled to a second bit line, the select gate line, and the floating gate of the second floating gate transistor.

10. A random bit system comprising:
a control line;
an erase line;
a plurality of select gate lines;
a plurality of first bit lines; and
a first random bit page comprising a plurality of random bit cells, each comprising:
a latch having a first terminal and a second terminal; and
a first nonvolatile memory cell comprising:
a first storage circuit coupled to the first terminal of the latch, the first storage circuit comprising a first floating gate transistor having a first terminal, a second terminal, and a floating gate;
a first control element having a first terminal coupled to the control line, and a control terminal coupled to the floating gate of the first floating gate transistor;
a first erase element having a first terminal coupled to the erase line, and a control terminal coupled to the floating gate of the first floating gate transistor; and
a first read circuit coupled to a corresponding first bit line of the plurality of first bit lines, the first select gate line, and the floating gate of the first floating gate transistor, wherein the first terminal of the first floating gate transistor is coupled to the first terminal of the latch, and the second terminal of the first floating gate transistor is floating.

11. The random bit system of claim 10, wherein during a first stage of an enroll operation:
the plurality of first bit lines, the control line, and the erase line are at a first voltage;
the first read circuit is inactivated; and
the latch is configured to be enabled and settle one of the first terminal and the second terminal of the latch to be at a high operation voltage and another to be at a low operation voltage.

12. The random bit system of claim 11, wherein during a second stage of the enroll operation:
the control line is at a second voltage;
the erase line is at the second voltage or the high operation voltage;
the plurality of first bit lines are at the high operation voltage;
the first read circuit is inactivated; and
if the first terminal of the latch is settled to the low operation voltage after the first stage of the enroll operation, a voltage applied on the floating gate of the first floating gate transistor causes Fowler-Nordheim (FN) tunneling at the floating gate of the first floating gate transistor.

13. The random bit system of claim 10, wherein:
the first storage circuit further comprises an isolation transistor having a first terminal coupled to the first terminal of the latch, a second terminal coupled to the first terminal of the first floating gate transistor, and a control terminal;
the isolation transistor is configured to be turned on during an enroll operation, and to be turned off to isolate the latch and the first floating gate transistor otherwise; and
the second terminal of the first floating gate transistor is floating.

14. The random bit system of claim 10, further comprising:
a first word line; and
a first select control line;
wherein the first read circuit comprises:
a word select transistor having a first terminal coupled to the corresponding first bit line, a second terminal, and a control terminal coupled to the first word line;
a read transistor having a first terminal coupled to the second terminal of the word select transistor, a second terminal, and a floating gate coupled to the floating gate of the first floating gate transistor; and
a select gate transistor having a first terminal coupled to the second terminal of the read transistor, a second terminal coupled to a first voltage terminal, and a control terminal coupled to the first select gate line.

15. The random bit system of claim 14, wherein during a read operation:
the control line and the erase line are at a first voltage;
the corresponding first bit line is at a third voltage;
the first word line and the first select control line are at a fourth voltage; and
the first read circuit is configured to generate a read current through the corresponding first bit line according to a state of the floating gate of the first floating gate transistor.

16. The random bit system of claim 10, wherein the first read circuit comprises:

a read transistor having a first terminal coupled to the first bit line, a second terminal, and a floating gate coupled to the floating gate of the first floating gate transistor; and a select gate transistor having a first terminal coupled to the second terminal of the read transistor, a second terminal coupled to a first voltage terminal, and a control terminal coupled to the first select gate line.

17. The random bit system of claim 10, wherein during an erase operation before an enroll operation:

the plurality of first bit lines and the control line are at a first voltage;

the erase line is at a second voltage; and the first read circuit and the latch are inactivated.

18. The random bit system of claim 10, further comprising a plurality of second bit lines;

wherein each random bit cell further comprises a second nonvolatile memory cell comprising:

a second storage circuit coupled to the second terminal of the latch, the second storage circuit comprising a second floating gate transistor having a first terminal, a second terminal, and a floating gate;

a second control element having a first terminal coupled to the control line, and a control terminal coupled to the floating gate of the second floating gate transistor;

a second erase element having a first terminal coupled to the erase line, and a control terminal coupled to the floating gate of the second floating gate transistor; and a second read circuit coupled to a corresponding second bit line of the plurality of second bit lines, the select gate line, and the floating gate of the second floating gate transistor.

19. The random bit system of claim 10, wherein the plurality of random bit cells of the first random bit page are erased and enrolled simultaneously.

20. The random bit system of claim 10, further comprising:

a multiplexer coupled to the plurality of first bit lines; and a sensing amplifier coupled to the multiplexer;

wherein the plurality of random bit cells of the first random bit page are read sequentially according to the multiplexer.

21. The random bit system of claim 10, further comprising:

a second select gate line; and a second random bit page comprising a plurality of random bit cells, each being coupled to a corresponding first bit line of the plurality of first bit lines, the control line, the erase line, and the second select gate line.

* * * * *